United States Patent
Jewram et al.

(10) Patent No.: US 8,076,773 B2
(45) Date of Patent: Dec. 13, 2011

(54) THERMAL INTERFACE WITH NON-TACKY SURFACE

(75) Inventors: Radesh Jewram, Lakeville, MN (US); Sanjay Misra, Shoreview, MN (US)

(73) Assignee: The Bergquist Company, Chanhassen, MN (US)

( * ) Notice: Subject to any disclaimer, the term of this patent is extended or adjusted under 35 U.S.C. 154(b) by 0 days.

(21) Appl. No.: 11/964,219

(22) Filed: Dec. 26, 2007

(65) Prior Publication Data

US 2009/0166854 A1  Jul. 2, 2009

(51) Int. Cl.
- H01L 23/34 (2006.01)
- F28F 13/00 (2006.01)
- H05K 7/20 (2006.01)

(52) U.S. Cl. ........ 257/713; 165/185; 361/705; 438/584; 438/122; 257/E23.08; 257/E21.09; 257/E21.499

(58) Field of Classification Search .................. 257/713, 257/720
See application file for complete search history.

(56) References Cited

U.S. PATENT DOCUMENTS

| | | |
|---|---|---|
| 4,938,992 A | 7/1990 | Mears |
| 5,300,809 A | 4/1994 | Makamura et al. |
| 5,679,457 A | 10/1997 | Bergerson |
| 5,738,936 A | 4/1998 | Hanrahan |
| 5,950,066 A | 9/1999 | Hanson et al. |
| 6,090,484 A | 7/2000 | Bergerson |
| 6,162,663 A * | 12/2000 | Schoenstein et al. .......... 438/122 |
| 6,165,612 A | 12/2000 | Misra |
| 6,197,859 B1 | 3/2001 | Green et al. |
| 6,344,104 B1 | 2/2002 | Sekiya et al. |
| 6,359,334 B1 | 3/2002 | Jiang |
| 6,399,209 B1 | 6/2002 | Misra et al. |
| 6,657,296 B2 | 12/2003 | Ho et al. |
| 6,657,297 B1 * | 12/2003 | Jewram et al. ................. 257/720 |
| 6,667,548 B2 * | 12/2003 | O'Connor et al. ............. 257/712 |
| 6,974,723 B2 * | 12/2005 | Matayabas et al. ........... 438/106 |
| 2002/0034651 A1 * | 3/2002 | Yamagata et al. ............. 428/472 |
| 2004/0009353 A1 | 1/2004 | Knowles et al. |
| 2005/0013119 A1 | 1/2005 | Misra |
| 2005/0077618 A1 | 4/2005 | McCutcheon et al. |
| 2006/0246276 A1 * | 11/2006 | Chung .......................... 428/323 |
| 2007/0164424 A1 | 7/2007 | Dean et al. |
| 2007/0235861 A1 * | 10/2007 | Chien et al. ................... 257/712 |
| 2007/0241303 A1 | 10/2007 | Zhong et al. |

* cited by examiner

*Primary Examiner* — Zandra V. Smith
*Assistant Examiner* — Lawrence Tynes, Jr.
(74) *Attorney, Agent, or Firm* — Haugen Law Firm PLLP

(57) ABSTRACT

A thermal interface member includes a bulk layer and a surface layer that is disposed on at least a portion of a surface of the bulk layer. The surface layer is highly thermally conductive, has a melting point exceeding a solder reflow temperature, and has a maximum cross-sectional thickness of less than about 10 microns.

3 Claims, 5 Drawing Sheets

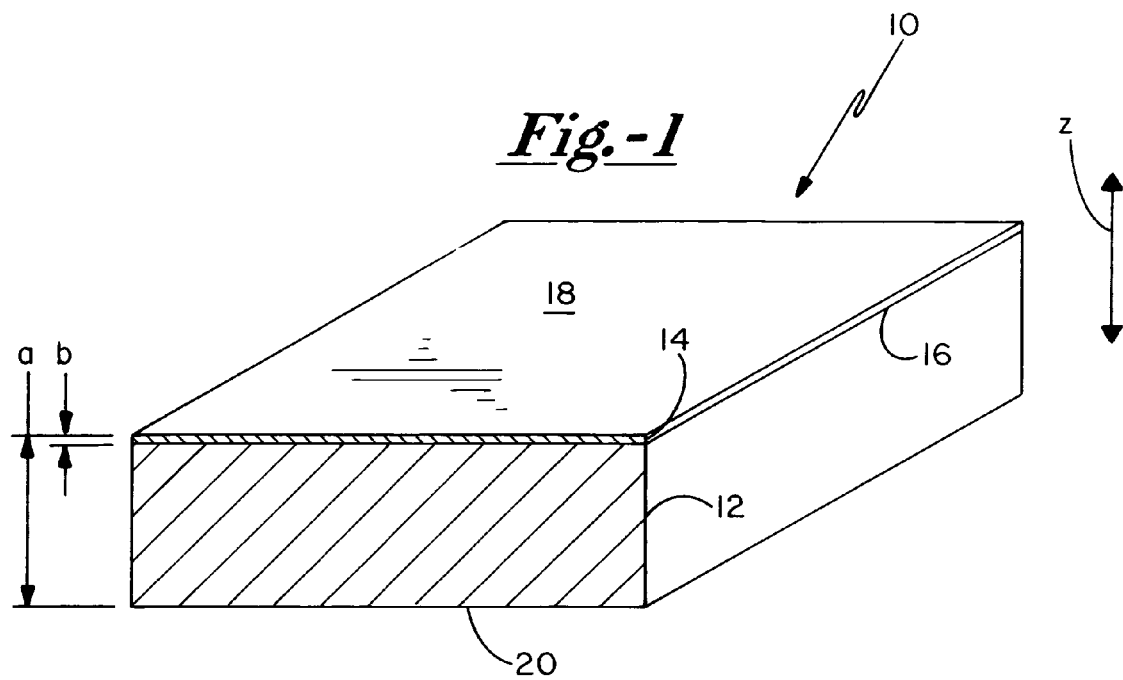
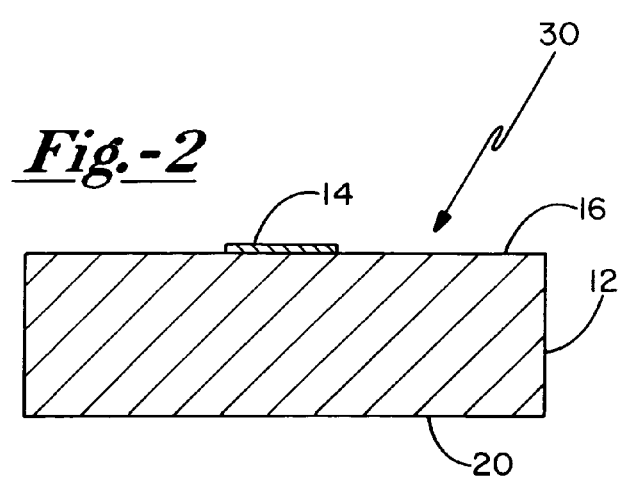

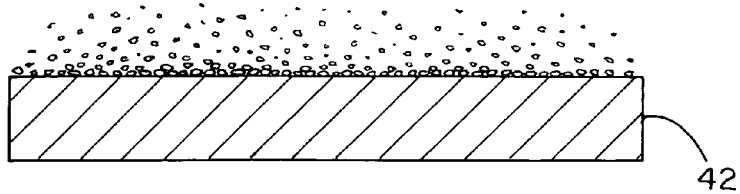
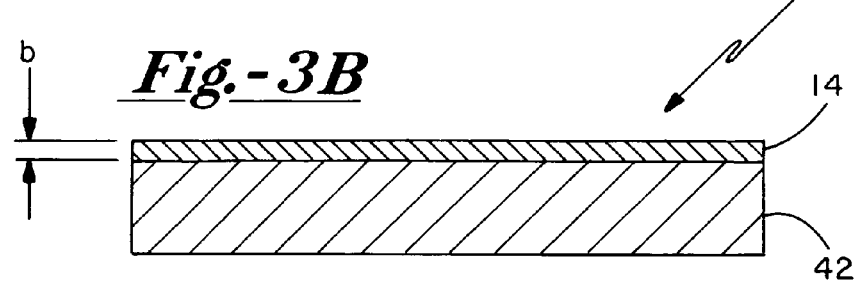
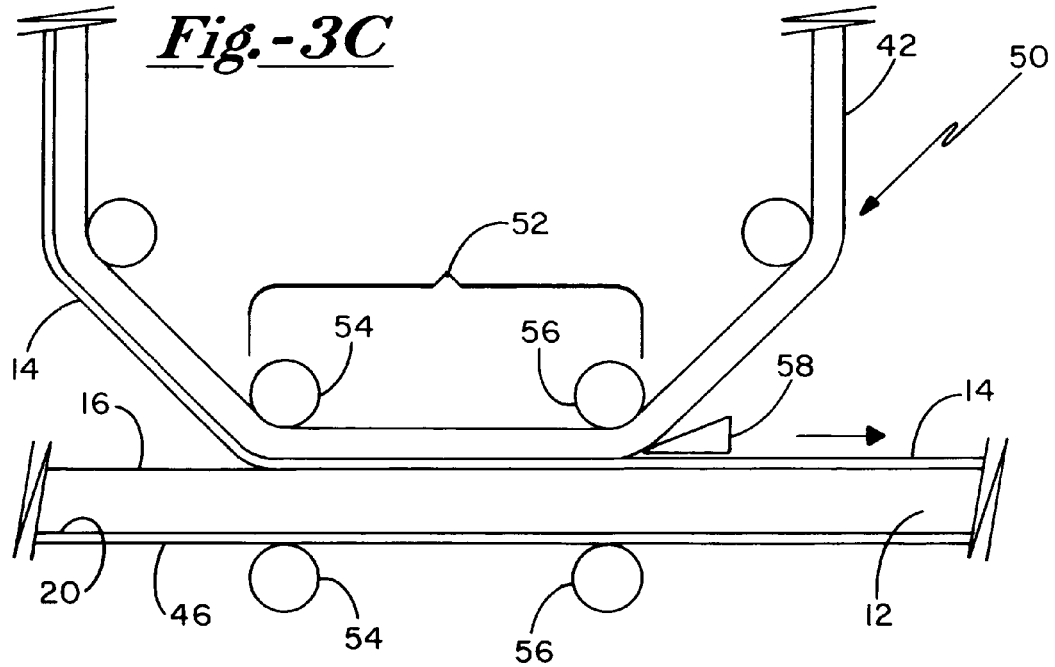

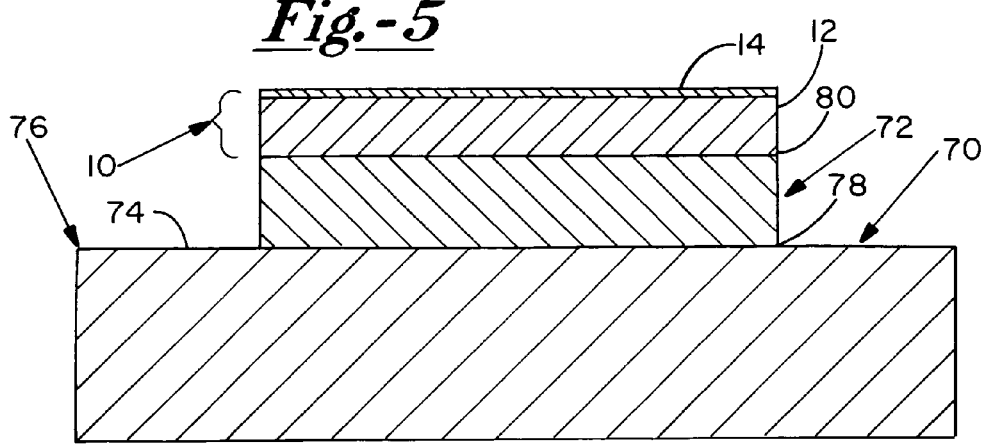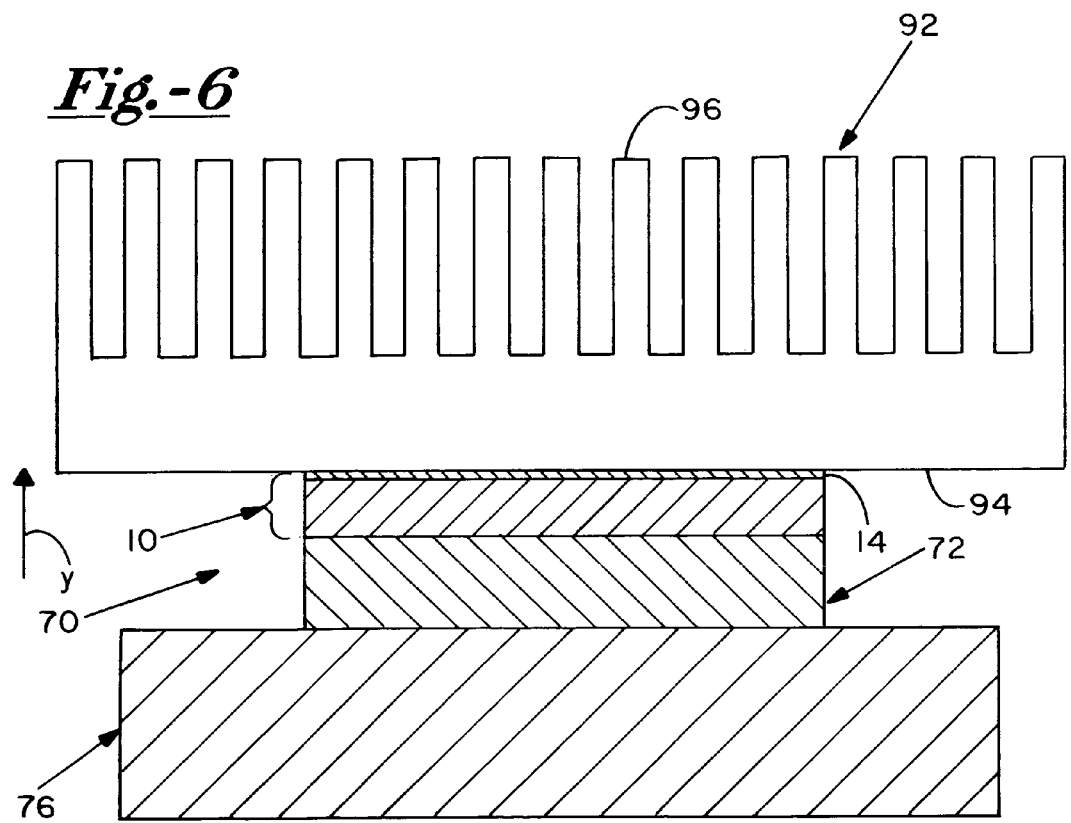

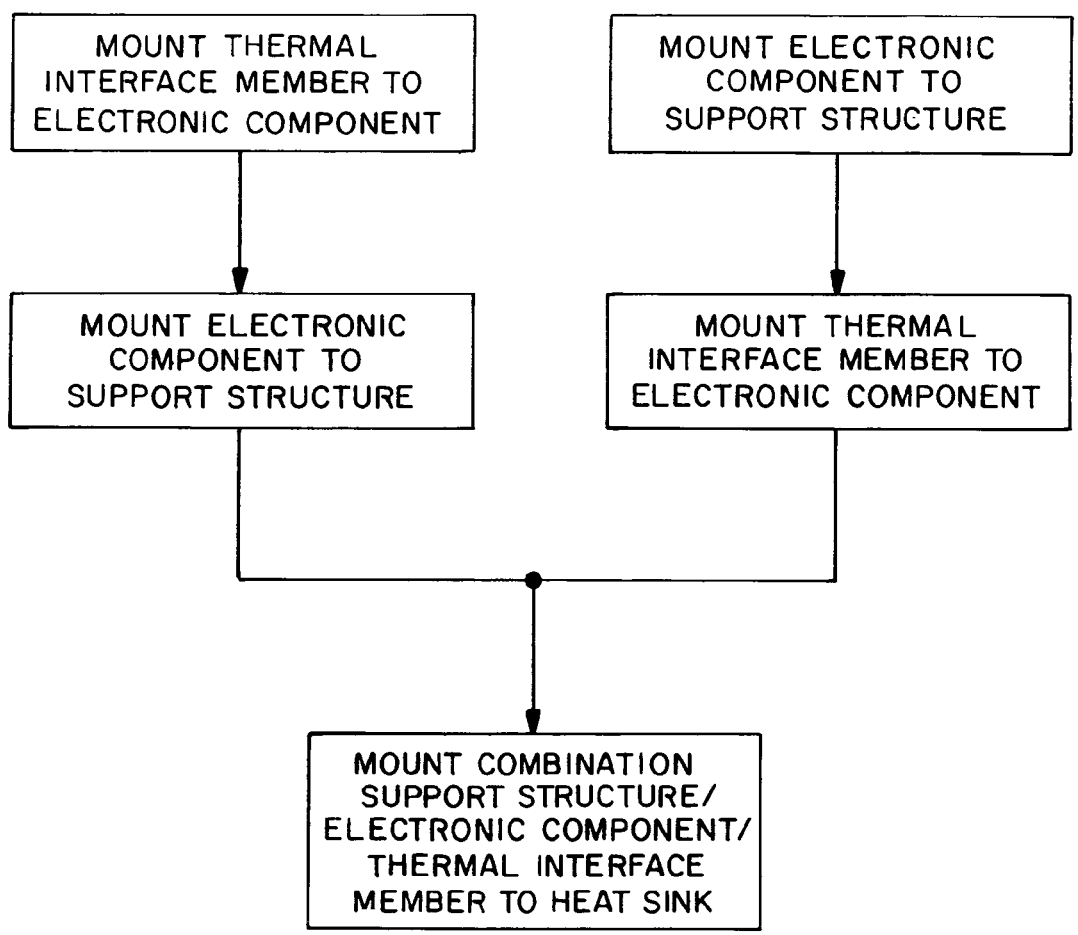

THERMAL INTERFACE WITH NON-TACKY SURFACE

FIELD OF THE INVENTION

The present invention relates to thermal interfaces for use in connection with a heat dissipation arrangement involving heat-generating electronic devices, and more particularly to a thermal interface member incorporating a substantially thermally transparent, conformable, and non-tacky surface layer that retains such characteristics above solder reflow temperatures.

BACKGROUND OF THE INVENTION

Thermal interfaces are widely used in heat dissipating applications where excess thermal energy is desired to be transferred from one location to another. The thermal interface is commonly positioned between such locations in a manner to accommodate the desired heat transfer in an efficient and mechanically useful manner. Example applications of such thermal interfaces is in the electronics industry, wherein electronic devices must be cooled in some fashion in order to maintain minimum threshold performance characteristics. A common method of cooling such electronic devices is through heat dissipation away from the heat-generating electronic devices. Such heat dissipation may be accomplished, for example, by thermally coupling the electronic device to a heat sink, which typically possesses a relatively high thermal dissipation capacity. Common heat sinks exhibit high heat dissipation characteristics through features such as materials, surface area, and exposure to cooling media.

Thermal coupling of heat-generating elements, such as electronic devices, to heat sinks may be facilitated by thermal interface materials and structures. For example, direct physical coupling between a heat-generating element and a heat sink may be difficult due to relative external geometries, materials, and spatial restrictions in the vicinity of the heat-generating element. In this case, thermal interfaces can act as the physical connection mechanism between the heat-generating element and the heat sink without significant impedance to heat transfer. Moreover, because heat transfer can be significantly impeded at thermal barriers where thermal energy must pass through media of relatively low thermal conductivity, thermal interfaces can increase the efficiency of heat transfer to a heat sink by minimizing the presence of thermal barriers. For example, thermal interfaces having relatively low modulus values can "conform" to surface irregularities in the heat-generating element and the heat sink, thereby minimizing and/or eliminating voids between surfaces that can be filled with relatively low thermal conductivity media such as air. Consequently, thermal interfaces have been found to significantly enhance heat transfer away from a variety of heat-generating devices.

In some applications, thermal interfaces have utilized relatively low modulus materials such as microcrystalline waxes, and silicone greases, gels, and waxes, in order to provide a "conformability" characteristic to the thermally conductive interface. Conformability of the interface may be achieved through materials having low modulus values at room temperature, or may instead be achieved as a result of a "phase changing" material which significantly softens at temperatures at or below the operating temperatures of the heat-generating devices to which the interface is coupled. The relative softness of the interface material can result in a surface tackiness that hinders such handling of such interfaces, such as in assembly of the thermal interfaces to respective components.

To overcome this problem, it has been found that the provision of an "anti-blocking" or release layer formed on at least one outer surface of the thermal interface assists production, assembly, and handling of the thermal interface. Moreover, such an outer non-tacky release layer serves to provide significant protection against contamination to the remainder of the thermal interface. In some cases, the anti-blocking or release layer may comprise a liner film that must be removed prior to the point in time when the thermal interface is placed into contact with the heat-generating device. This removal operation has frequently proven to be bothersome, and is time consuming and labor intensive. In other cases, the anti-blocking or release layer may be integrally formed, or permanently secured to, the remainder of the thermal interface. In such cases, however, the anti-blocking layer significantly inhibits the overall conformability of the interface.

In addition to the above, thermal interfaces are routinely installed in heat dissipation arrangements in a specific order in which the thermal interface is first secured to the heat sink, with the resultant combination then secured to a previously constructed package, such as an integrated circuit board. This protocol has been followed primarily due to the fact that mounting the thermal interface to components of an electronic package in its construction process is difficult and messy to handle. Even for thermal interfaces with anti-blocking layers, temperatures reached in solder reflow processes to secure electronic components to the package compromise the effectiveness of the anti-blocking layer.

In view of the above, therefore, it is a principal object of the present invention to provide a thermal interface incorporating one or more highly thermally conductive surfaces which remain non-tacky at or above solder reflow temperatures, while also enabling good overall conformability to adjacent surfaces.

It is a further object of the present invention to provide a thermal interface member having a non-tacky surface layer that is highly thermally conductive, conformable, and remains non-tacky at or above solder reflow temperatures.

It is another object of the present invention to provide a method for constructing a thermal interface, wherein the surface layer of such interface is deposited on a release substrate and subsequently placed in registration with a bulk layer of the interface.

It is a still further object of the present invention to provide a method for constructing a package by securing a thermal interface to a package component prior to solder reflow, and subsequently securing the combination to a heat sink.

SUMMARY OF THE INVENTION

By means of the present invention, excess thermal energy generated by an electronic component may be efficiency dissipated to a heat sink or other thermal dissipater. In particular, the present invention provides a thermal interface that is highly conformable, but yet remains non-tacky at or above solder reflow temperatures. Consequently, the thermal interface of the present invention facilitates handling and thermal package assembly operations while providing a highly thermally conductive pathway from a heat-generating electronic device to a heat dissipater.

In a particular embodiment, the thermal interface member of the present invention includes a bulk layer having a thermal conductivity of at least about 0.5 W/m·K, and a surface layer that is disposed on at least a portion of at least one surface of the bulk layer. The surface layer includes a maximum cross-sectional thickness of less than about 10 microns, a thermal conductivity along at least the thickness dimension of at least about 50 W/m·K, and a melting point exceeding a solder reflow temperature. In some cases, the melting point of the surface layer is at least about 300° C.

In another embodiment, the thermal interface member of the invention includes a thermally conductive polymer-based bulk layer and a metallic surface layer disposed on at least a portion of at least one of first and second surfaces of the bulk layer. The metallic surface layer has a maximum cross-sectional thickness dimension of less than about 10 microns.

An apparatus for use in a heat dissipating arrangement includes a heat-generating component and a thermal interface member thermally coupled to the heat-generating component and having a thermal conductivity of at least about 0.5 W/m·K. The thermal interface member includes a bulk layer and a surface layer disposed on at least a portion of a surface of the bulk layer. The surface layer has a maximum cross-sectional thickness dimension of less than about 10 microns, a melting point exceeding a solder reflow temperature, and a modulus that is greater than about $10^7$ Pa.

In a further aspect of the invention, a method for constructing a thermal interface member is provided by depositing a thermally conductive material on a substrate to a thickness of less than about 10 microns so as to form a coated substrate, and placing the coated substrate in registration with a bulk layer surface of the thermal interface member, such that the thermally conductive material of the coated substrate is contacted with the bulk layer surface. Finally, the substrate is separated from the thermally conductive material, such that the thermally conductive material remains in contact with the bulk layer surface as a surface layer.

In a further aspect, a package includes a support structure having a first surface, an electronic component having a mounting portion and a heat dissipation surface, wherein the mounting portion is coupled to the first surface of the support structure, and a thermal interface member that is thermally coupled to the heat dissipation surface of the electronic component. The thermal interface member includes a bulk layer and a surface layer, wherein the bulk layer has a thermal conductivity of at least about 0.5 W/m·K, and the surface layer has a maximum cross-sectional thickness of less than about 10 microns. Moreover, the surface layer has a thermal conductivity of at least about 50 W/m·K and a melting point exceeding a solder reflow temperature.

A method for constructing an electronic component package includes providing a thermal interface member having a bulk layer with a thermal conductivity of at least about 0.5 W/m·K, and a surface layer disposed on at least a portion of a surface of the bulk layer, with the surface layer having a maximum cross-sectional thickness of less than about 10 microns, a melting point exceeding a solder reflow temperature, and a thermal conductivity of at least about 50 W/m·K. The method further includes providing a support structure having a first surface, and providing an electronic component having a mounting portion and a heat dissipation surface. The thermal interface member is thermally coupled to the electronic component by placing the bulk layer of the thermal interface member in contact with the heat dissipation surface of the electronic component. Prior to, or subsequent to, the thermal coupling, the mounting portion of the electronic component may be mounted to the first surface of the support structure. Subsequent to mounting the mounting portion of the electronic component to the first surface of the support structure, a heat sink is thermally coupled to the thermal interface member.

BRIEF DESCRIPTION OF THE DRAWINGS

FIG. 1 is a perspective view of a thermal interface member of the present invention;

FIG. 2 is a cross-sectional side view of a thermal interface member of the present invention;

FIG. 3A is a side view of a portion of a process for constructing a thermal interface member of the present invention;

FIG. 3B is a side view of a portion of a process for constructing a thermal interface member of the present invention;

FIG. 3C is a side view of a portion of a process for constructing a thermal interface member of the present invention;

FIG. 5 is a cross-sectional side view of an electronic component package of the present invention;

FIG. 6 is a cross-sectional side view of an electronic component package of the present invention; and FIG. 7 is a flow diagram depicting the process steps in constructing an electronic component package of the present invention.

DETAILED DESCRIPTION OF THE PREFERRED EMBODIMENTS

Figure 4:
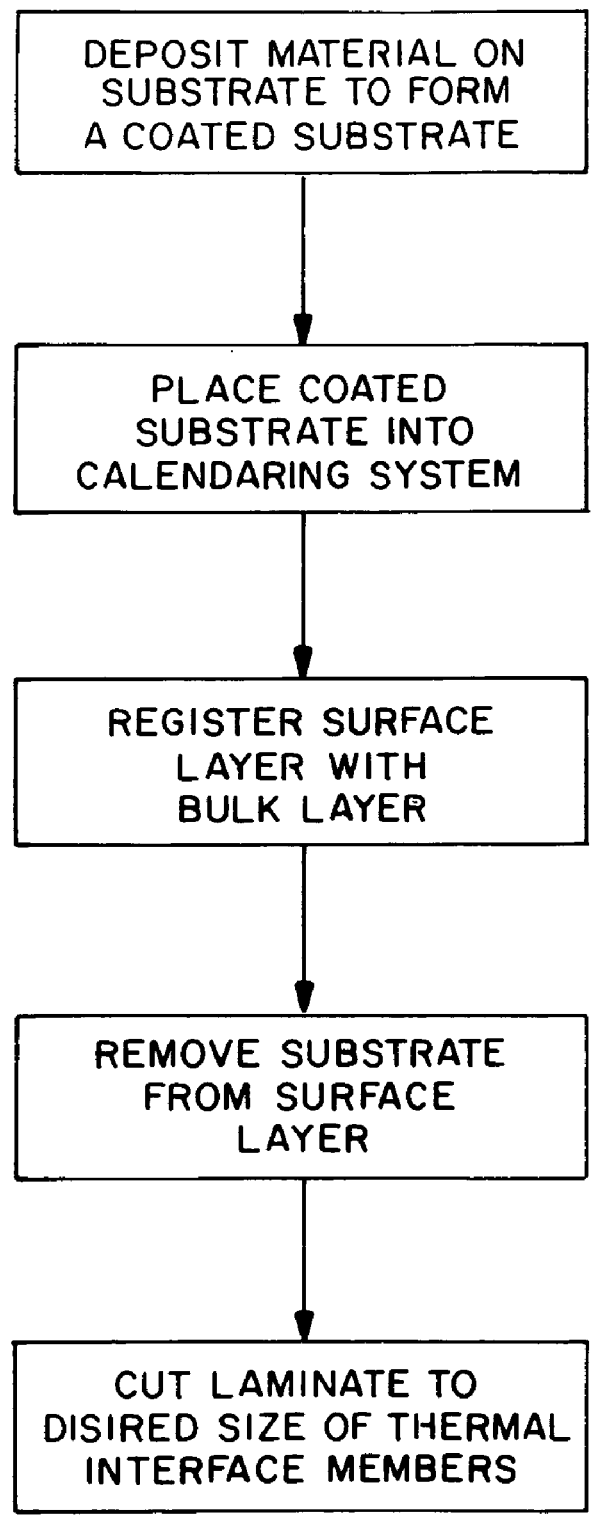
FIG. 4 is a flow diagram demonstrating the process steps in constructing a thermal interface member of the present invention.

The objects and advantages enumerated above together with other objects, features, and advances represented by the present invention will now be presented in terms of detailed embodiments described with reference to the attached drawing figures which are intended to be representative of various possible configurations of the invention. Other embodiments and aspects of the invention are recognized as being within the grasp of those having ordinary skill in the art.

With reference now to the drawing figures, and first to FIG. 1, a thermal interface member 10 includes a bulk layer 12 and a surface layer 14 disposed at first surface 16 of bulk layer 12. As described above, surface layer 14 acts as an "anti-blocking" or "release" layer for thermal interface member 10. In most embodiments, thermal interface member 10 is thermally conductive, and is thermally conductive at least along axis "z". In many embodiments, however, thermal interface member 10 is thermally conductive along all axes. Typically, surface layer 14 has a thermal conductivity of at least about 50 W/m·K, and bulk layer 12 has a thermal conductivity of at least about 0.5 W/m·K. It is to be understood that thermal interface member 10 has an overall thermal conductivity that is intermediate the conductivities of surface layer 14 and bulk layer 12. "Overall" thermal conductivity refers to the thermal conductance as measured from a first surface 18 to a second surface 20 of thermally conductive member 10, or vice versa. It is to be understood that localized thermal conductivity values at points between first and second surfaces 18, 20 may, in fact, be less than the values described above. However, the net thermal conductivity, at least along axis "z" of thermal interface member 10 is as described above.

Bulk layer 12 is preferably thermally conductive at least along axis "z", and may be a conformable material. In some embodiments, bulk layer 12 may be a phase-changing material. For example, bulk layer 12 may comprise a microcrystalline wax or a silicone-based polymer including silicone waxes, silicone greases, and silicone gels. Further examples of formulations useful in bulk layer 12 include those described in U.S. Pat. Nos. 5,950,066 and 6,197,859, which are incorporated herein by reference. In embodiments wherein bulk layer 12 is a phase-changing material, bulk layer 12 may have a melting point in the range of between about 40°

C. and about 80° C. As such, bulk layer 12 may become at least partially liquid at temperatures encountered during normal operation of the heat-generating device or devices in connection with which thermal interface member 10 is being used. The phase changing characteristic provides a highly conformable interface for making good thermal contact with respective heat dissipation surfaces, such as surfaces of the heat-generating device. As is known in the art, phase-changing thermal interface materials enable relative ease of handling at room temperature while being highly conformable at operating temperatures.

In some embodiments, bulk layer 12 may further include thermally conductive particulate matter dispersed therein to enhance the thermal conductivity of bulk layer 12. A variety of thermally conductive particulate matter may be utilized to aid in the thermal conductivity of bulk layer 12, including, for example, alumina, aluminum nitride, boron nitride, graphite, silicon carbine, diamond, metallic powders and combinations thereof, with an average particle size of up to about 200 microns. In typical embodiments, the particulate filler material may be provided in bulk layer 12 at a concentration of between about 10 and 95 percent by weight. The loading levels of the particulate filler can affect the overall modulus of bulk layer 12. Accordingly, it is desired to maintain an operating temperature modulus of bulk layer 12 of no greater than about $10^6$ Pa. In some applications, however, modulus values greater than $10^6$ Pa for bulk layer 12 are permissible.

Bulk layer 12 may be formed with a thickness dimension "a" of between about 50 and 500 microns, with thicknesses in the range of between about 100 and 150 microns being most commonly employed.

Surface layer 14 is preferably a highly thermally conductive body comprised of one or more thermally conductive materials. Surface layer 14 may be disposed at, for example, all or a portion of first and/or second surfaces 16, 20 of bulk layer 12. Surface layer 14 is disposed along a substantially entire area of first surface 16 of bulk layer 12 in the embodiment illustrated in FIG. 1. Surface layer 14, however, may be provided in any of a variety of continuous or discontinuous patterns on one or more surfaces of bulk layer 12. It is contemplated that surface layer 14 acts as a non-tacky surface at which manipulation of thermal interface member 10 may be focused. For example, "pick and place" assembly operations may move the thermal interface member from an assembly line into an operating position in a heat-generating device package by automated equipment. Such equipment may removably engage to thermal interface member 10 at surface layer 14. In the absence of a non-tacky surface layer 14, such automated equipment can be fouled by the tackiness of, for example, bulk layer 12. Accordingly, use of automated assembly equipment typically requires some form of non-tacky surface at which the equipment can efficiently removably engage to the thermal interface member. Since equipment utilized in assembly procedures may require a non-tacky area that is less than an area presented by, for example, first surface 16 of bulk layer 12, surface layer 14 may cover less than an entire area of, for example, first and second surfaces 16, 20 of bulk layer 12.

An additional aspect in the enablement of ease of handling of thermal interface member 10 in production and assembly operations is the provision of surface layer 14 that exhibits a "non-tacky" surface. Such a characteristic may be accomplished through a variety of mechanisms, such as material type and material phase. Therefore, it is one aspect of the invention to provide surface layer 14 with a non-tacky upper surface 18. For some applications, it is desired that surface layer 14 be non-tacky both at room temperature and at elevated temperatures, such as above a solder reflow temperature. For example, thermal interface member 10 may be utilized in connection with a package assembly process which involves elevated temperatures, including temperatures at which solder reflow occurs to secure various package components to one another. Consequently, it is desired that surface layer 14 remain substantially intact at such elevated temperatures, as well as retain a non-tacky surface characteristic.

In order to accomplish the goals stated above, surface layer 14 may be in solid form, and have a melting point which exceeds a respective solder reflow temperature. For typical applications, solder reflow temperatures range between about 200 and about 260° C., depending upon the type of solder utilized. Accordingly, it is desired that surface layer 14 have a melting point temperature which is greater than the solder reflow temperature of the respective solder being utilized. In some cases, the melting point of surface layer 14 is greater than about 300° C. The following Table 1 demonstrates example solder alloy compositions, and their respective phase-change temperatures:

| Alloy Composition | Liquidous Temp. (° C.) | Reflow Temp. (° C.) | Melting Range # (° C.) |
|---|---|---|---|
| Sn.—2Ag |  |  | 221-226 |
| Sn.—3.5Ag | 221 | 240-250 |  |
| Sn.—0.7Ag | 227 | 245-255 |  |
| Sn.—3.0Ag—0.5Cu | 220 | 238-248 |  |
| Sn.—3.2Ag—0.5Cu | 218 | 238-248 | 217-218 |
| Sn.—3.5Ag—0.75Cu | 218 | 238-248 |  |
| Sn.—3.8Ag—0.7Cu | 220 | 238-248 | 217-210 |
| Sn.—4Ag—0.5Cu |  |  | 217-219 |
| Sn.—4Ag—1.0Cu | 220 | 238-248 | 217-220 |
| Sn.—4.7Ag—1.7Cu | 244 | 237-247 |  |

In order to maximize the effectiveness of thermal interface member 10, surface layer 14 is preferably thermally conductive, and may be substantially "thermally transparent", in that the thermal conductivity of surface layer 14 may be significantly greater than the thermal conductivity of bulk layer 12. In some embodiments, surface layer 14 may have a thermal conductivity of at least about 50 W/m·K, and may typically have a thermal conductivity of between about 200 and 800 W/m·K. The thermal conductivities identified above refer to the thermal conductivity at least along axis "z", but may also hold true along all directional axes.

An additional aspect of the present invention is the overall conformability of thermal interface member 10. As described above, it is an important feature of thermal interfaces to conform well to surfaces against which the interfaces are mounted so as to minimize thermal barriers and to thereby enhance thermal conductivity. Conventional thermal interfaces incorporating an "anti-blocking" or release layer typically either require that such layer be manually removed prior to installation, or such layers, when left in place in the interface, reduce thermal performance of the interface as a result of a lack of conformability of such layer and/or a relatively low thermal conductivity of the layer material itself. Accordingly, surface layer 14 may be both highly thermally conductive, as described above, and highly conformable. Surface layer 14 may therefore have a thickness of less than about 10 microns. Surface layer 14 is effective even in situations where its modulus is greater than $10^6$ Pa due to its thinness.

Applicants have determined that one manner in which to accomplish the above-described conformability in surface layer 14 is through the provision of a very small thickness dimension "b" of surface layer 14. Depending upon the materials utilized for surface layer 14, thickness dimension "b" may be less than about 10 microns, and may typically be between about 2 and 6 microns. Thickness dimension "b" of surface layer 14 may refer to a maximum cross-sectional thickness of surface layer 14.

Surface layer 14 may comprise one or more of a variety of materials compatible with the aspects described above. A particular class of materials that Applicants have found to be useful in the surface layers of the present invention are metals and/or metal complexes which are capable of being deposited into a thin layer, such as less than about 6 microns in thickness. Example materials for surface layer 14 include aluminum, copper, silver, and copper-tungsten. Other materials and material combinations, however, are also contemplated as being useful in surface layer 14. An example of another useful material is graphite.

FIG. 2 is an example of an embodiment of a thermal interface member 30 wherein surface layer 14 is disposed at only a portion of bulk layer 12. Various arrangements of surface layer 14 with respect to bulk layer 12 are contemplated as being within the scope of the present invention. For example, surface layer 14 may be disposed at one or both of first and second surfaces 16, 20 of bulk layer 12, and may be disposed along at least a portion of such one or more surfaces. As such, surface layer 14 may cover all or part of first and/or second surface 16, 20 of bulk layer 12.

It is contemplated that first surface 14 may be provided at bulk layer 12 through one of a variety of processes, including, for example, vapor deposition, plasma polymerization, spray coating, sputtering, and the like. One method for applying surface layer 14 to bulk layer 12 that will be described herein for example purposes is vapor deposition of a metal material as surface layer 14.

As illustrated in FIGS. 3A-3B, metal vapor, such as aluminum is deposited on a release liner substrate 42 as follows:

Release liner substrate 42 may be placed in a vacuum chamber and transferred between an unwind roll and a wind-up roll, both positioned in the vacuum chamber. Aluminum spools are then placed at receptacles within the vacuum chamber, wherein the aluminum spools are heated at the receptacles to an evaporative temperature of the aluminum, while the vacuum chamber is substantially evacuated. Vapor-state aluminum is then emitted from the aluminum spools, and is deposited on the moving substrate positioned about 12 inches from the aluminum receptacles.

The thickness "b" of surface layer 14 at release liner substrate 42 may be controlled by the speed of the substrate within the vapor deposition chamber. Typically, substrate 42 is operated between the unwind roll and wind-up roll at a speed of between about 400-1200 ft/min while vapor deposition is occurring. Once the substrate 42 has been exposed to this metal vapors, the chamber is restored to atmospheric pressure. In some embodiments, the vapor-deposited substrate may pass over a chill roll to bring the vapor-state metal to solid-state on the substrate prior to being rolled at the wind-up roll.

Once the deposited material reaches a predetermined minimal thickness, such as between about 2 and 6 microns, the coated substrate 44 is transferred to a calendaring operation as illustrated in FIG. 3C so as to be placed in registration with bulk layer 12. The calendaring operation 50, as illustrated in FIG. 3C, places surface layer 14 in registration with first surface 16 of bulk layer 12 at registration location 52, wherein surface layer 14 is adhered to bulk layer 12 through pressure generated at respective roller pairs 54-54, 56-56. A splitter 58 is provided for removing release liner 42 from surface layer 14, such that surface layer 14 remains in contact with bulk layer 12. In order to keep bulk layer 12 from undesirably adhering to components to calendaring system 50, such as rollers 54, 56, a release liner 46 may be provided at second surface 20 of bulk layer 12. Such release liner 46 may be removed from bulk layer 12 at a desired point in time prior to installation of thermal interface member 10 in, for example, a heat-generating device package.

FIG. 4 is a flow diagram demonstrating the process steps of thermal interface member fabrication, as described above in FIGS. 3A-3C. In particular, a material for use in surface layer 14 is deposited onto a release liner to a predetermined thickness so as to form a coated substrate. As described above, such material or materials are preferably thermally conductive, and may be, for example, a metal, a metal complex, and/or other materials that are able to be deposited on release liner 42. In some embodiments, the material may be applied to the substrate to a predetermined thickness of less than about 6 microns. Release liners are well known in the art, and it is contemplated that conventional release liners capable of being relatively easily removed from surface layer 14 may be utilized in the thermal interface member manufacturing process. An example release liner 42 useful in receiving a deposited surface layer 14, and subsequently being removed therefrom, is polyethylene terephthalate (PET).

The coated substrate is then placed into a calendaring operation in an orientation with the release liner coming into contact with the calendaring rolls, and the surface layer material being exposed for registration with a bulk layer 12. The registration of the surface layer with the bulk layer causes the surface layer to adhere to the bulk layer with greater strength than the coupling between the surface layer and its respective release liner substrate. As a result, the substrate is then removed from the surface layer while the surface layer remains in contact with the bulk layer. Individual thermal interface members may then be die cut to desired size. In this form, the thermal interface members have opposing non-tacky surfaces so as to be easily handled in transport and package assembly steps. Typically, the release liner positioned at, for example, second surface 20 of bulk layer 12 is removed immediately prior to installation of thermal interface member at the heat-generating device.

Thermal interface member 10 may be used in connection with heat dissipation from a heat-generating component package. As illustrated in FIG. 5, package 70 includes a heat-generating electronic component 72 disposed on a first surface 74 of support structure 76. Electronic component 72 includes a mounting portion 78 that is coupled to first surface 74 of support structure 76, and a heat dissipation surface 80 that is thermally coupled to thermal interface member 10. In some embodiments, heat dissipation surface 80 may be thermally coupled to bulk layer 12 of thermal interface layer 10. Such thermal coupling may be in the form of physical contact between bulk layer 12 of thermal interface member 10 and heat dissipation surface 80 of electronic component 72. Through such an arrangement, heat generated by electronic component 72 is transferred to thermal interface member 10 via the thermal coupling thereof at heat dissipation surface 80. While heat dissipation surface 80 is depicted in FIG. 5 as being substantially opposite from mounting portion 78, it is to be understood that heat dissipation surface 80 may be any surface of electronic component 72 that is convenient and/or effective in thermally coupling electronic component 72 to thermal interface member 10. In addition, it is to be understood that electronic component 72 may be thermally coupled to thermal interface member 10 through means other than direct physical connection, such as through a secondary interface media or additional connection devices.

In the embodiment illustrated in FIG. 5, bulk layer 12 of thermal interface member 10 may be adhered to heat dissipation surface 80 directly as a result of the inherent adhesion properties of bulk layer 12. In other embodiments, however, thermal interface member 10 may be secured to electronic component 72 through, for example, a thermally conductive adhesive material, fasteners, and the like. Moreover, thermal interface member 10 may be oriented such that surface layer 14 is in contact with, or is in facing relationship with, heat dissipation surface 80 of electronic component 72.

Electronic device 72 is used herein in a comprehensive sense, and is intended to include components incorporated in a variety of electronic systems, such as data processing, communications, power supply systems, and the like. Example devices contemplated as electronic component 72 include semiconductor devices such as transistors and diodes, as well as passive components.

Electronic component 72, in the embodiment illustrated in FIG. 5, is secured to a circuit board 76 which may be a dielectric material having conductive traces at first surface 74, or may incorporate other types of electrical connections. In some embodiments, support structure 76 may be a thermally conductive material having a dielectric layer at first surface 74 upon which electronic component 72 is mounted. Various arrangements and materials are contemplated as being useful for support structure 76.

As shown in FIG. 6, a heat sink 92 may be thermally coupled to package 70, such as at thermal interface member 10. In some embodiments, thermal coupling of heat sink 92 to package 70 is effectuated by physical contact between first surface 94 of heat sink 92 and first surface 18 of thermal interface member 10, such that surface layer 14 is in thermal contact with first surface 94. As described above, thermal interface member 10, and particularly surface layer 14, is conformable so as to operably conform to first surface 94. Such conformability enhances heat transfer efficiency between thermal interface member 10 and heat sink 92. Heat sink 92, as illustrated in FIG. 6, may have a configuration which incorporates a relatively high surface area, such as through fins 96. The use of heat sinks in heat dissipation applications is well understood, and it is contemplated that conventional heat sink designs may be utilized in the arrangements of the present invention. Heat transfer in the arrangement of FIG. 6 is in the direction indicated by arrow "y", and is specifically from heat-generating component 72, through thermal interface member 10, to heat sink 92, and ultimately to the environment surrounding heat sink 92.

The arrangement illustrated in FIG. 6 may be constructed as depicted in the flow diagram of FIG. 7. In particular, thermal interface member 10 may be mounted to heat dissipation surface 80 of electronic component 72, and mounting portion 78 of electronic component 72 may then be mounted to first surface 74 of support structure 76, with the resulting combination being then coupled to heat sink 92, such as at first surface 18 of thermal interface member 10. Alternatively, electronic component 72 may be first mounted to first surface 74 of support structure 76, and thermal interface member 10 then mounted to heat dissipation surface 80 of electronic component 72. A heat sink 92 may then be thermally coupled to such combination as illustrated in FIG. 6.

The processes described above are contrasted with the conventional process for manufacturing an electronic component package, in that conventional techniques first mount the thermal interface member to the heat sink, and subsequently connect the electronic component/support structure combination to the heat sink/thermal interface member combination. Typically, this final assembly step is undertaken by original equipment manufacturers who sell complete electronic component packages. The final assembly step, however, requires a process step for removing the release liner from the thermal interface member (such as release liner 46 from bulk layer 12) prior to connection of the thermal interface member/heat sink combination to the electronic component. This process step is time consuming, and can sometimes result in damage to the thermal interface member, resulting in product loss and/or reduced product performance. The thermal interface member of the present invention enables coupling of the thermal interface member to the electronic component/support structure combination at the package manufacturer. Where the thermal interface member is mounted to the electronic component prior to electronic component to the support structure, the thermal interface member of the present invention is capable of withstanding solder reflow temperatures required in securing the electronic component to the support structure. Moreover, surface layer 14 acts to protect bulk layer 12 from contaminants during the solder reflow process. The electronic components may also be shipped in current surface mount technology (SMT) format without concern for the thermal interface member sticking to the SMT tapes and reels, because of the non-tacky surface presented by surface layer 14 prior to coupling to heat sink 92.

The invention has been described herein in considerable detail in order to comply with the patent statutes, and to provide those skilled in the art with the information needed to apply the novel principles and to construct and use embodiments of the invention as required. However, it is to be understood that the invention can be carried out by specifically different devices and that various modifications can be accomplished without departing from the scope of the invention itself.

What is claimed is:

1. A conformable thermal interface member, comprising: a body having:
    (a) a bulk layer having a modulus of less than about $10^6$ Pa, and a thermal conductivity of at least about 0.5 W/m·K; and
    (b) a surface layer disposed on said bulk layer, said surface layer defining an exterior engagement surface of said body and having:
        (i) a maximum cross sectional thickness of less than about 10 µm;
        (ii) a thermal conductivity along at least a thickness dimension of said surface layer of at least about 50 W/m·K; and
        (iii) a melting point exceeding a solder reflow temperature.

2. A conformable thermal interface member as in claim 1 wherein said surface layer has a melting point of at least about 300° C.

3. A conformable thermal interface member as in claim 1 wherein said surface layer includes a metal or metal complex.

* * * * *